(12) United States Patent
Shirakawa et al.

(10) Patent No.: US 10,895,607 B2
(45) Date of Patent: Jan. 19, 2021

(54) METHOD FOR TESTING MULTICORE CABLE, METHOD FOR MANUFACTURING MULTICORE CABLE ASSEMBLY, AND MULTICORE CABLE TEST DEVICE

(71) Applicant: Hitachi Metals, Ltd., Tokyo (JP)

(72) Inventors: Yohei Shirakawa, Tokyo (JP); Yoshitake Ageishi, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 56 days.

(21) Appl. No.: 16/197,465

(22) Filed: Nov. 21, 2018

(65) Prior Publication Data
US 2019/0250202 A1 Aug. 15, 2019

(30) Foreign Application Priority Data

Feb. 15, 2018 (JP) .................. 2018-024769

(51) Int. Cl.
| | |
|---|---|
| H01B 11/20 | (2006.01) |
| G01R 31/02 | (2006.01) |
| G01R 31/60 | (2020.01) |
| H01B 13/016 | (2006.01) |
| G01R 19/165 | (2006.01) |
| H01B 13/06 | (2006.01) |
| G01R 1/04 | (2006.01) |
| H01R 43/28 | (2006.01) |

(52) U.S. Cl.
CPC .......... *G01R 31/60* (2020.01); *G01R 1/0416* (2013.01); *G01R 19/16576* (2013.01); *H01B 13/016* (2013.01); *H01B 13/067* (2013.01); *H01R 43/28* (2013.01)

(58) Field of Classification Search
CPC .............. G01R 31/60; G01R 19/16576; H01B 13/016; H01B 13/067; H01R 43/28
See application file for complete search history.

(56) References Cited

U.S. PATENT DOCUMENTS 5,384,540 A * 1/1995 Dessel .................. G01R 31/60
324/539
5,592,344 A * 1/1997 Tsuruoka ................. G11B 5/03
360/66

FOREIGN PATENT DOCUMENTS

JP 2004251771 A 9/2004

* cited by examiner

*Primary Examiner* — Clayton E. LaBalle
*Assistant Examiner* — Michael A Harrison
(74) *Attorney, Agent, or Firm* — Scully, Scott, Murphy & Presser, PC

(57) ABSTRACT

A method for testing a multicore cable that includes a single common shield covering plural insulated wires. The testing method includes inputting a test signal, by capacitive coupling, to an end portion of the insulated wire under test among end portions of the insulated wires exposed at one end of the multicore cable, and measuring voltages of output signals output by capacitive coupling respectively from end portions of the insulated wires exposed at the other end of the multicore cable, and identifying the other end portion of the insulated wire under test based on the measured voltages. The voltages of output signals are measured in a state that an output variation reduction capacitive element is connected in series with a coupling capacitance generated by the capacitive coupling.

6 Claims, 9 Drawing Sheets

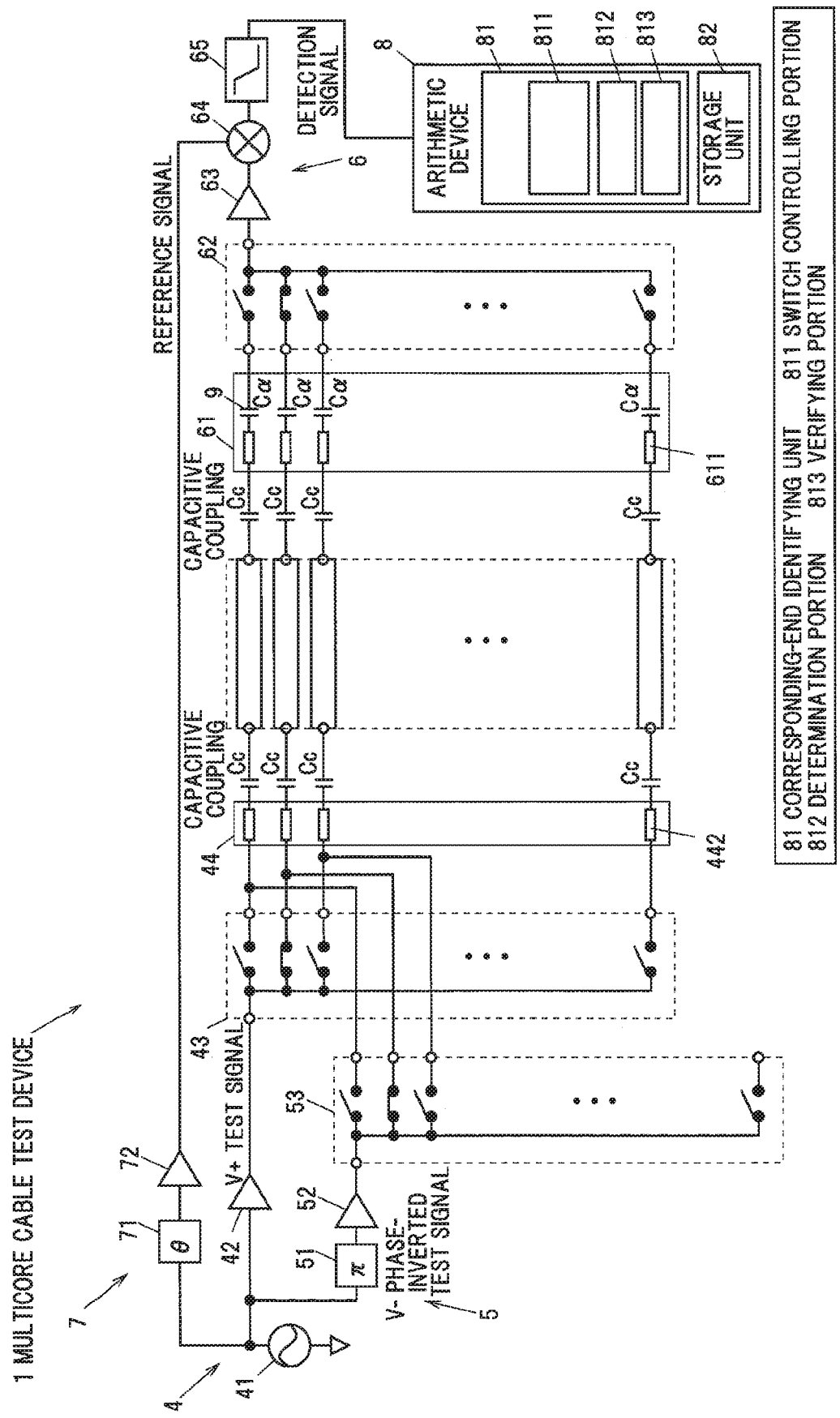

METHOD FOR TESTING MULTICORE CABLE, METHOD FOR MANUFACTURING MULTICORE CABLE ASSEMBLY, AND MULTICORE CABLE TEST DEVICE

CROSS-REFERENCE TO RELATED APPLICATIONS

The present application is based on Japanese patent application No. 2018-024769 filed on Feb. 15, 2018, the entire contents of which are incorporated herein by reference.

BACKGROUND OF THE INVENTION

1. Field of the Invention

The invention relates to a method for testing a multicore cable, a method for manufacturing a multicore cable assembly, and a multicore cable test device.

2. Description of the Related Art

A multicore cable is known in which multiple insulated wires each having an insulation around a conductor are covered with a single jacket. Also, a multicore cable used for, e.g., medical probe cables is known which has several tens to several hundreds of insulated wires (coaxial wires etc.).

For the multicore cable having the numerous insulated wires, it is difficult to use a color code so that every insulated wire has a different color insulation. In addition, in case that the insulated wires are twisted together inside the multicore cable, each insulated wire is not located at the same position. Therefore, when connecting a multicore cable having numerous insulated wires to connectors or circuit boards, a test method is required to somehow identify a correspondence relation between one end portion and the other end portion of each of the insulated wires exposed from both ends of the multicore cable.

As a test method to identify the correspondence relation between one end portion and the other end portion of insulated wires contained in the multicore cable, for example, there is a method in which a test signal is input to one end portion of a given insulated wire and voltage output from the other end portion is measured.

To test the multicore cable having the numerous insulated wires, when a conductor of each insulated wire is exposed at an end portion and an electrode for supplying a test signal is directly brought into contact with the conductor, it is necessary to bring the electrode into contact with the conductor of every insulated wire to identify the correspondence relation and it thus takes very long time for the test. Therefore, the test to identify the correspondence relation between one end portion and the other end portion of insulated wires contained in a multicore cable having numerous insulated wires is desired to be conducted by a method in which an electrode is placed on an insulation and an AC test signal is input to a conductor by capacitive coupling without contact (see, e.g., JP 2004/251771 A).

SUMMARY OF THE INVENTION

A variation in coupling capacitance at a capacitive coupling portion may occur if the electrode is misaligned with respect to the insulated wire, if the outer covering of the insulated wire has a thickness abnormality in which the thickness of the outer cover is partially different, or if minute foreign matter such as dust is sandwiched between the electrode and the insulated wire. When the coupling capacitance varies, output voltage during test varies, which may cause misdetection.

It is an object of the invention to provide a method for testing a multicore cable that reduces a variation in output voltage caused by variation in coupling capacitance so as to improve a detection accuracy, as well as a method for manufacturing a multicore cable assembly and a multicore cable test device.

According to an embodiment of the invention, a method for testing a multicore cable that comprises a single common shield covering a plurality of insulated wires comprises:

inputting a test signal, by capacitive coupling, to an end portion of the insulated wire under test among end portions of the insulated wires exposed at one end of the multicore cable; and measuring voltages of output signals output by capacitive coupling respectively from end portions of the insulated wires exposed at the other end of the multicore cable, and identifying the other end portion of the insulated wire under test based on the measured voltages, wherein the voltages of output signals are measured in a state that an output variation reduction capacitive element is connected in series with a coupling capacitance generated by the capacitive coupling.

According to another embodiment of the invention, a method for manufacturing a multicore cable assembly that comprises a multicore cable comprising a single common shield covering a plurality of insulated wires and connectors or circuit boards provided at both ends of the multicore cable, the manufacturing method comprising:

arranging wires;

stripping the insulated wires to expose conductors at end portions; and connecting the exposed conductors to terminals of the connectors or electrode patterns of the circuit board, wherein the arranging wire comprises identifying a corresponding end portion by identifying a correspondence relation between one end portion and the other end portion of the insulated wires exposed from both ends of the multicore cable and arranging end portions of the insulated wires exposed from the both ends of the multicore cable in desired order, the identifying a corresponding end portion comprises inputting a test signal, by capacitive coupling, to an end portion of the insulated wire under test among end portions of the insulated wires exposed at one end of the multicore cable, measuring voltages of output signals output by capacitive coupling respectively from end portions of the insulated wires exposed at the other end of the multicore cable, and identifying the other end portion of the insulated wire under test based on the measured voltages, and the voltages of output signals are measured in a state that an output variation reduction capacitive element is connected in series with a coupling capacitance generated by the capacitive coupling.

According to another embodiment of the invention, a multicore cable test device for testing a multicore cable comprising a single common shield covering a plurality of insulated wires to identify a correspondence relation between one end portion and the other end portion of the insulated wires exposed from both ends of the multicore cable comprises:

a test signal input means that inputs a test signal, by capacitive coupling, to an end portion of the insulated wire under test among end portions of the insulated wires exposed at one end of the multicore cable;

a corresponding-end identifying unit that measures voltages of output signals output by capacitive coupling respectively from end portions of the insulated wires exposed at the other end of the multicore cable, and identifies the other end portion of the insulated wire under test based on the measured voltages; and an output variation reduction capacitive element that is connected in series with a coupling capacitance generated by the capacitive coupling.

Effects of the Invention

According to an embodiment of the invention, a method for testing a multicore cable can be provided that reduces a variation in output voltage caused by variation in coupling capacitance so as to improve a detection accuracy, as well as a method for manufacturing a multicore cable assembly and a multicore cable test device.

BRIEF DESCRIPTION OF THE DRAWINGS

Next, the present invention will be explained in more detail in conjunction with appended drawings, wherein:

FIG. 7 is a schematic configuration diagram illustrating a multicore cable test device in the embodiment of the invention;

DETAILED DESCRIPTION OF THE PREFERRED EMBODIMENTS

Embodiment

An embodiment of the invention will be described below in conjunction with the appended drawings.

General Configuration of Multicore Cable Test Device 1

Figure 1:
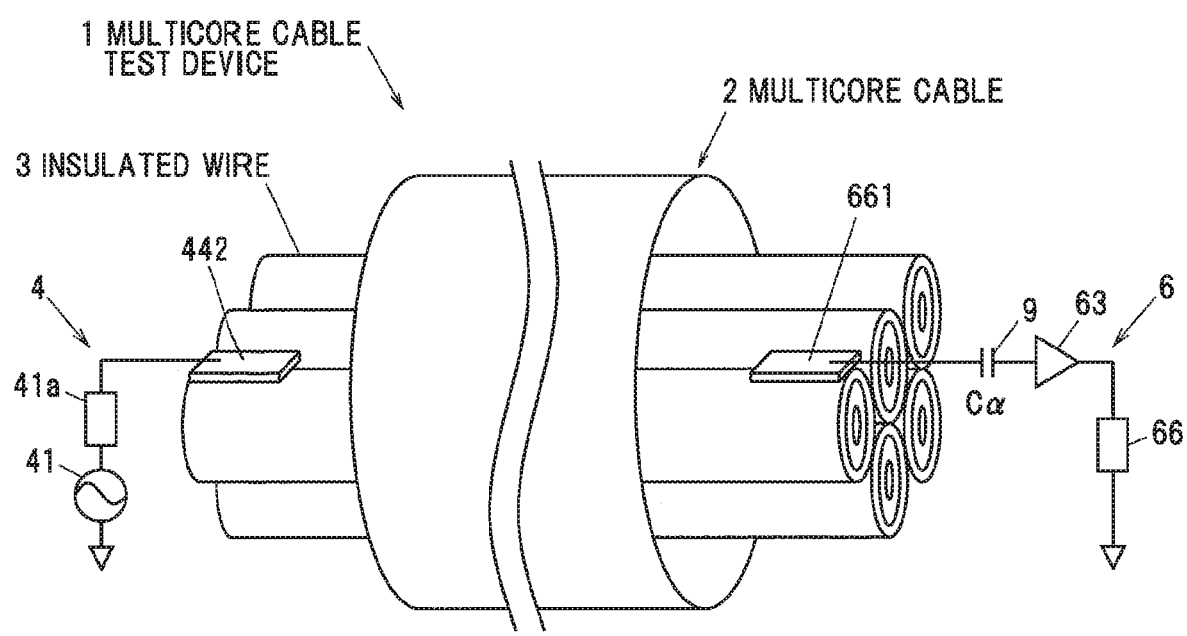
FIG. 1 is a schematic diagram illustrating a multicore cable test device which is used in a method for testing a multicore cable in an embodiment of the present invention.
Figure 2A:
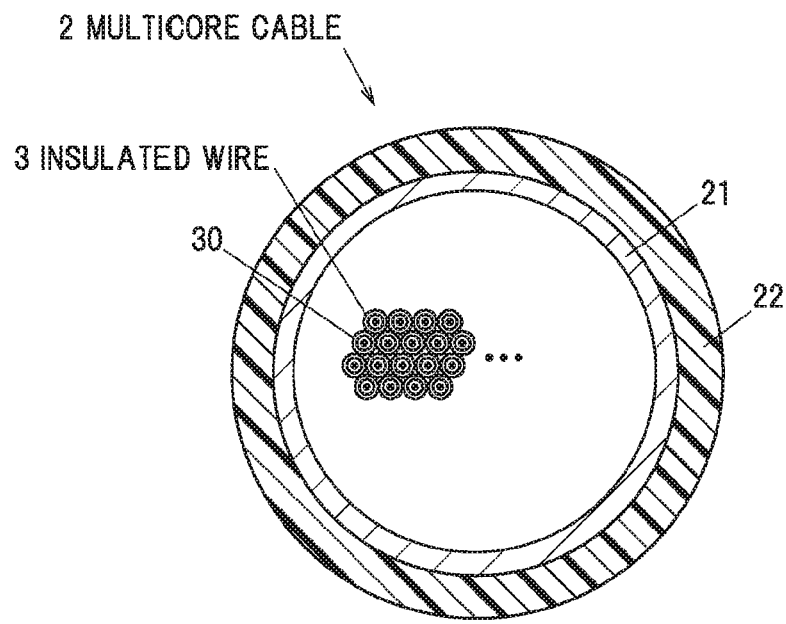
FIG. 2A is a schematic cross-sectional view showing a multicore cable taken perpendicular to a longitudinal direction.

FIG. 1 is a schematic diagram illustrating a multicore cable test device which is used in a method for testing a multicore cable in the present embodiment. FIG. 2A is a schematic cross-sectional view showing a multicore cable taken perpendicular to a longitudinal direction and FIG. 2B is a cross sectional view showing an insulated wire taken perpendicular to the longitudinal direction.

A multicore cable test device 1 is used to identify a correspondence relation between one end portion and the other end portion of each insulated wire 3 exposed at both ends of a multicore cable 2. After identifying the correspondence relation between one end portion and the other end portion of the insulated wires 3 of the multicore cable 2, the insulated wires 3 at both ends of the multicore cable 2 are respectively connected to connectors or circuit boards (internal boards in sensor portions, etc.) (not shown in the drawings) according to the identified correspondence relation, and a multicore cable assembly is thereby obtained.

Figure 2B:
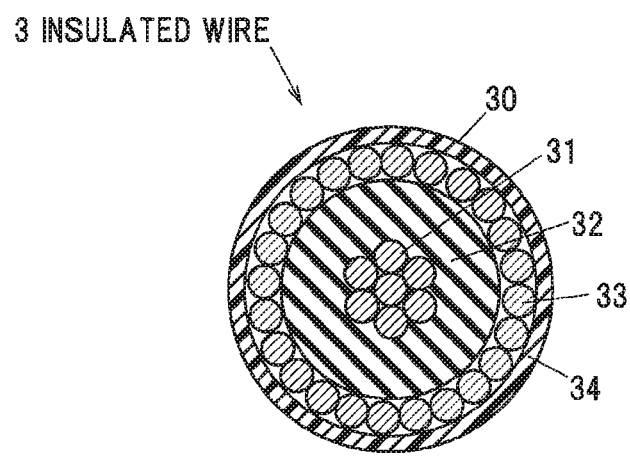
FIG. 2B is a cross sectional view showing an insulated wire taken perpendicular to the longitudinal direction.

As shown in FIGS. 2A and 2B, the insulated wire 3 used in the multicore cable 2 is a coaxial wire 30 in which an insulation 32, an outer conductor 33 and an outer covering 34 are sequentially provided around a center conductor 31. However, the insulated wire 3 is not limited thereto and may not have the insulation 32 and the outer conductor 33. The outer diameter of the coaxial wire 30 is, e.g., 0.2 mm to 0.5 mm. The multicore cable 2 is formed by sequentially providing a braided common shield 21 and a jacket 22 around multiple bundled coaxial wires 30. The number of insulated wires 3 in the multicore cable 2 is not specifically limited, and the invention is applicable to the multicore cable 2 having not less than three insulated wires 3. In the present embodiment, the number of insulated wires 3 contained in one multicore cable 2 is, e.g., about ten to three hundred.

Back to FIG. 1, the multicore cable test device 1 is provided with a test signal input means 4 and an output-side processing circuit 6. The test signal input means 4 inputs at least an AC test signal, by capacitive coupling, to an end portion of the insulated wire 3 under test among end portions of the insulated wires 3 exposed at one end of the multicore cable 2, and has a voltage source 41 for generating the test signal and electrodes 442 each brought into contact with an outer circumferential surface of the insulated wire 3 so that the test signal is input to the insulated wire 3 by capacitive coupling. The reference numeral 41a in FIG. 1 denotes an internal resistor of the voltage source 41.

In the present embodiment, since capacitive coupling is used to input the test signal to the insulated wires 3, an AC signal is used as the test signal. The frequency of the test signal needs to be smaller than the resonant frequency of the multicore cable 2, and can be appropriately determined depending on the structure, etc., of the multicore cable 2. In more detail, the frequency of the test signal is, e.g., not more than 10 MHz. In the present embodiment, the test signal V+ at 2.5 MHz is used.

Figure 3A:
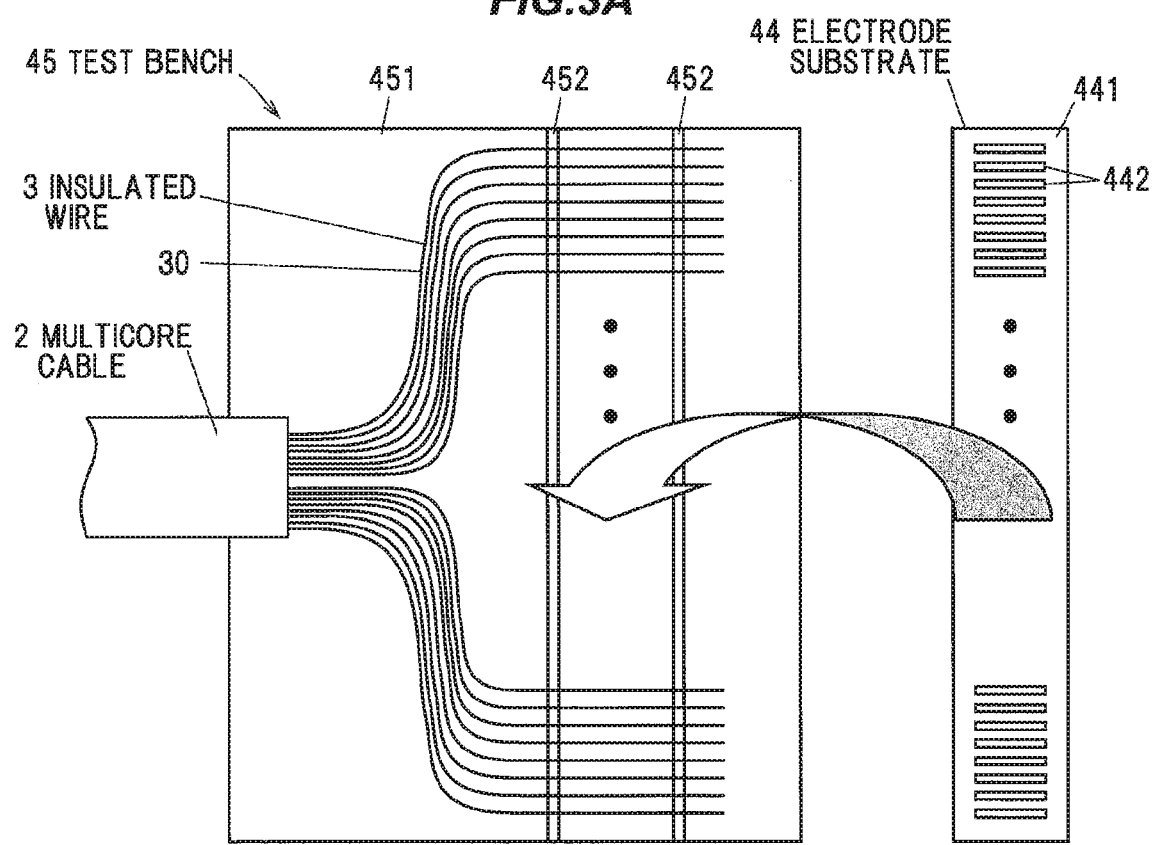
FIGS. 3A and 3B are explanatory diagrams illustrating the insulated wires fixed to a test bench.
Figure 3B:
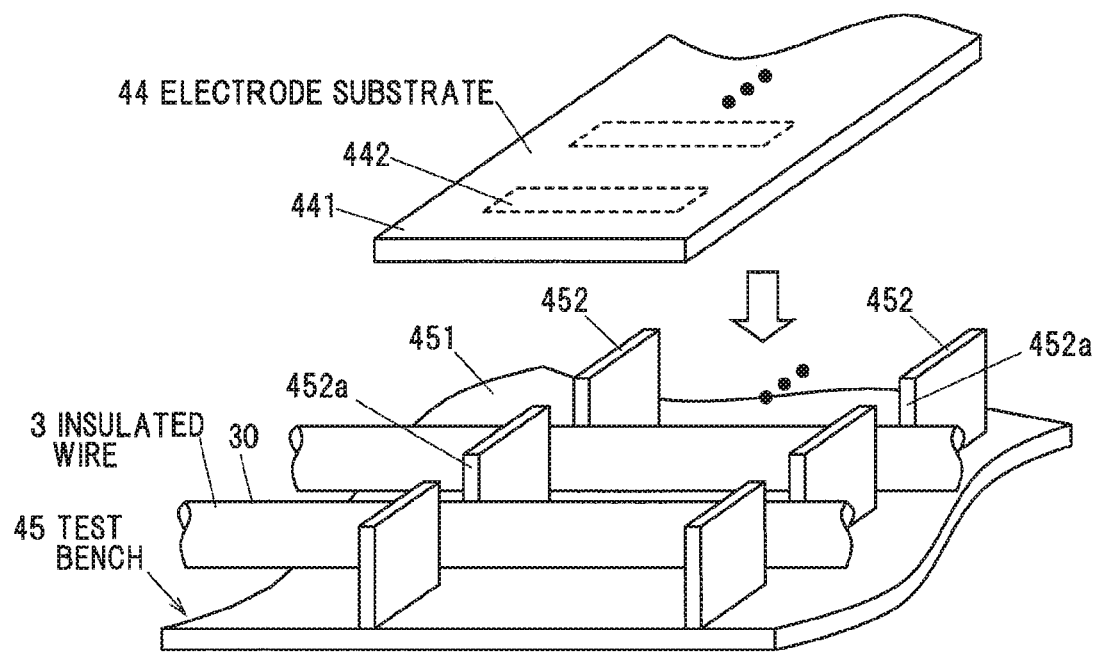

As shown in FIGS. 3A and 3B, the insulated wires 3 (the coaxial wires 30 in this example) exposed and aligned at one end of the multicore cable 2 are fixed to a test bench 45. The test bench 45 integrally has a base 451 and a pair of locking walls 452 arranged on the base 451 so as to face each other. Plural locking grooves 452a for locking the insulated wires 3 are formed at equal intervals on the both locking walls 452. The insulated wires 3 are respectively fitted and fixed to the locking grooves 452a and are thereby arranged in a row on the base 451 at predetermined intervals. However, the structure to fix the insulated wires 3 to the test bench 45 is not limited thereto. For example, the insulated wires 3 may be placed on an adhesive tape such as double-sided tape stuck to the base 451 so that the insulated wires 3 are adhered and fixed to the test bench 45. In addition, although the insulated wires 3 are arranged in a row at equal intervals in one direction (a direction perpendicular to a longitudinal direction of the insulated wire 3), arrangement of the insulated wires 3 may be appropriately changed.

The electrodes 442 are provided on an electrode substrate 44. The electrode substrate 44 has a dielectric substrate 441 and the electrodes 442 constructed from a wiring pattern formed on the dielectric substrate 441. The same number of electrodes 442 as the insulated wires 3 (or more than the insulated wires 3) are formed in alignment on the dielectric substrate 441 at the same intervals as the insulated wires 3 fixed to the locking grooves 452a. In addition, each electrode 442 is electrically connected to the voltage source 41 and receives input of the test signal.

In the present embodiment, the electrode substrate 44 is pressed, with a surface having the electrodes 442 facing downward, against the insulated wires 3 between the two locking walls 452. Thus, the electrodes 442 and the insulated wires 3 are sandwiched between the dielectric substrate 441 and the base 451. When the test signal is input to a given electrode 442 in this state, the test signal is input to the insulated wire 3 corresponding to the given electrode 442 by capacitive coupling. In the present embodiment in which the coaxial wire 30 is used as the insulated wire 3, the test signal is input to the outer conductor 33 of the insulated wire 3.

Back to FIG. 1, the output-side processing circuit 6 has a test bench (not shown) having the same structure as the test bench 45 and provided at an end of the multicore cable 2, and is configured that output signals from the insulated wires 3 (signals transmitted through the outer conductors 33) are output by capacitive coupling by pressing electrodes 611 of an electrode substrate (not shown) respectively against the insulated wires 3. Since the test bench and the electrode substrate of the output-side processing circuit 6 have the same configurations as the test bench 45 and the electrode substrate 44, the explanation thereof is omitted.

The output-side processing circuit 6 has a load resistor 66. Based on voltage applied to the load resistor 66 (a potential difference between both ends of the load resistor 66), the other end portion of the insulated wire 3 under test is identified by a corresponding-end identifying unit 81 (described later, see FIG. 7). The specific configuration, etc., of the multicore cable test device 1 including the test signal input means 4 and the output-side processing circuit 6 will be described later.

Output Variation Reduction Capacitive Element 9

The multicore cable test device 1 in the present embodiment is provided with output variation reduction capacitive elements 9 each of which is connected in series with coupling capacitance generated by capacitive coupling. The reason why the output variation reduction capacitive elements 9 are provided will be described below.

Figure 4A:
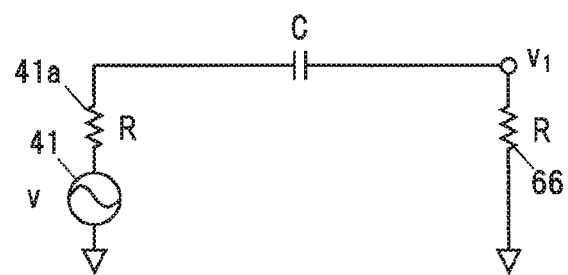
FIG. 4A is a diagram illustrating an equivalent circuit in Comparative Example in which an output variation reduction capacitive element is not provided.

Firstly, the case of not providing the output variation reduction capacitive element 9 will be examined. The equivalent circuit of the multicore cable test device not provided with the output variation reduction capacitive elements 9 in Comparative Example is expressed as shown in FIG. 4A, where C is coupling capacitance as a sum of capacitances on the input and output sides. In FIG. 4A, resistance of the internal resistor 41a of the voltage source 41 and resistance of the load resistor 66 are denoted by R. An input impedance $Z_{in}$ when viewing from the voltage source 41 side is expressed by the formula $Z_{in}=2R+1/(j\omega C)$. When $R \ll 1/\omega C$, the input impedance $Z_{in}$ is expressed by the formula $Z_{in} \approx 1/(\omega C) \times e^{-j\pi}$.

When voltage of the voltage source 41 is $v=v_o \times e^{j\omega t}$, output voltage $v_1$, which is voltage applied to the load resistor 66, is expressed by the formula:

$$v_1 = R/Z_{in} \times v \approx v_{o\omega} RCe^{j(\omega t+\pi)}$$

Here, let $\Delta C$ denotes variation in coupling capacitance and the coupling capacitance C is expresses as $C_0+\Delta C$. In this case, a ratio of output voltage with variation in coupling capacitance, $v_1(\Delta C)$, to output voltage without variation in coupling capacitance (when $\Delta C=0$), $v_1(0)$, i.e., variation in normalized output voltage $P(\Delta C)$ is expressed by the following formula (1):

$$P(DC) = \frac{v_1(DC)}{v_1(0)} = \frac{v_0 v R(C_0 + DC)e^{j(vt+p)}}{v_0 yRC_0 e^{j(yt+p)}} \qquad (1)$$
$$= 1 + \frac{DC}{C_0}$$

Figure 4B:
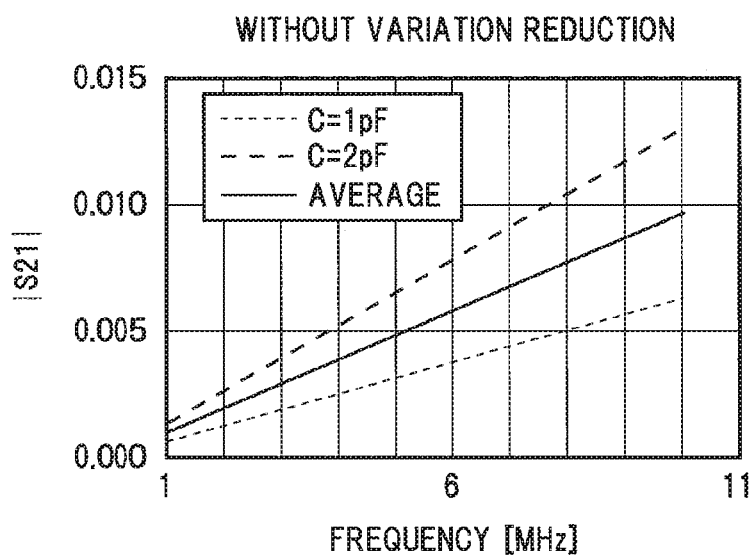
FIG. 4B is a graph showing a measurement result of change in gain (|S21|) of the circuit with respect to a frequency of detection signal.

The equivalent circuit of Comparative Example shown in FIG. 4A was actually made for evaluation, and change in gain (|S21|) with respect to a frequency of detection signal was measured when the coupling capacitance C was 1 pF and 2 pF ($C_o=1$ pF, $\Delta C=1$ pF). The measurement result is shown in FIG. 4B. In Comparative Example, change in the gain upon change in the value of the coupling capacitance C is large and variation in output voltage is large, as shown in FIG. 4B.

Figure 5A:
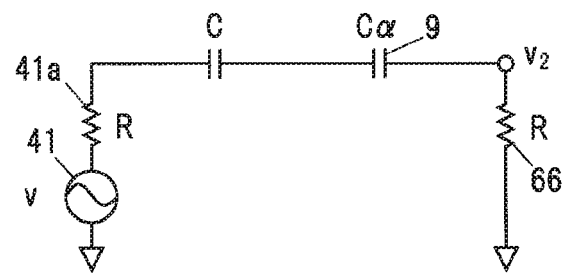
FIG. 5A is a diagram illustrating an equivalent circuit in Example of the invention.

Next, Example of the invention provided with the output variation reduction capacitive element 9 will be examined. The equivalent circuit in Example is expressed as shown in FIG. 5A. When $R \ll 1/\omega C+1/\omega C\alpha$, output voltage $v_2$ in Example is expressed by:

$$v_2 = R/Z_{in} \times v \approx v_{o\omega} R\{(C \cdot C\alpha)/(C + C\alpha)\}e^{j(\omega t+\pi)}$$

in the same manner as Comparative Example. Thus, a ratio of output voltage with variation in coupling capacitance, $v_2(\Delta C)$, to output voltage without variation in coupling capacitance (when $\Delta C=0$), $v_2(0)$, i.e., variation of normalized output voltage $Q(\Delta C)$ is expressed by the following formula (2):

$$Q(DC) = \frac{v_2(DC)}{v_2(0)} = \frac{v_0 yR \frac{(C_0+DC)Ca}{C_0+DC+Ca}e^{j(yt+p)}}{v_0 yR \frac{C_0 Ca}{C_0+Ca}e^{j(yt+p)}} \qquad (2)$$
$$= \frac{\left(1+\frac{DC}{C_0}\right)\left(1+\frac{Ca}{C_0}\right)}{1+\frac{DC}{C_0}+\frac{Ca}{C_0}}$$

Based on the formulas (1) and (2), a difference D in the amount of change with respect to $\Delta C$ between the variation in output voltage $P(\Delta C)$ in Comparative Example and the variation in output voltage $Q(\Delta C)$ in Example is expressed by the formula (3) below. D>0 based on the formula (3), which shows that variation in output voltage caused by variation in coupling capacitance can be reduced by inserting the output variation reduction capacitive element 9.

$$D = \frac{dP(DC)}{dDC} - \frac{dQ(DC)}{dDC} \qquad (3)$$

$$= \frac{1}{C_0} + \frac{1 + \frac{DC^2}{C_0^2} + 2\frac{DC}{C_0} + 2\frac{DCCa}{C_0^2} + \frac{Ca}{C_0}}{\left(1 + \frac{DC}{C_0} + \frac{Ca}{C_0}\right)^2}$$

Figure 5B:
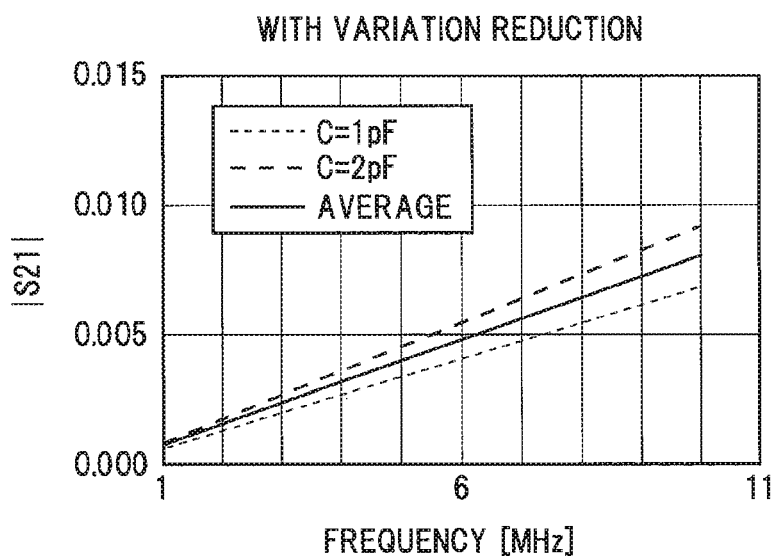
FIG. 5B is a graph showing a measurement result of change in gain (|S21|) of the circuit with respect to a frequency of detection signal.

The equivalent circuit of Example shown in FIG. 5A was actually made for evaluation, and change in gain (|S21|) with respect to a frequency of detection signal was measured when the coupling capacitance C was 1 pF and 2 pF (i.e., $C_o$=1 pF, ΔC=1 pF). The gain (|S21|) and the output voltage bear a proportional relationship. Thus, variation in the gain (|S21|) and variation in the output voltage also bear a proportional relationship. In addition, the normalized variation in the gain (|S21|) is equal to the normalized variation in the output voltage. The measurement result is shown in FIG. 5B. In Example, change in the gain upon change in the value of the coupling capacitance C is smaller than in Comparative Example and variation in output voltage is small, as understood by comparison of FIGS. 5B and 4B.

Figure 6:
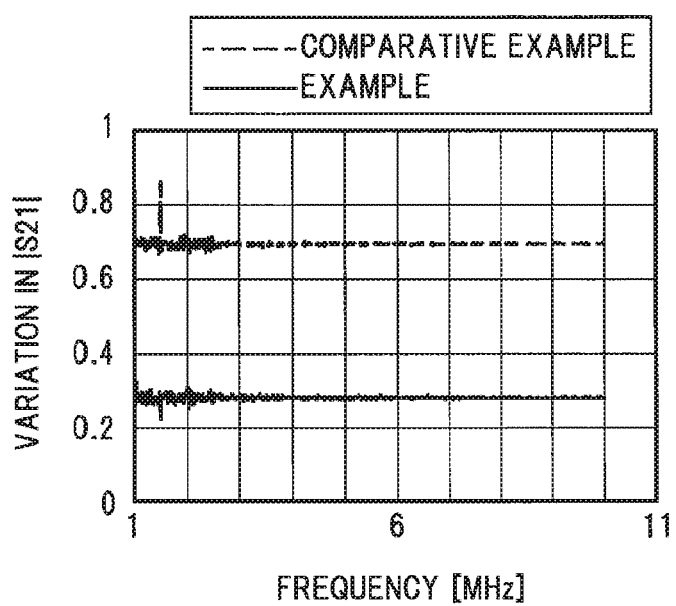
FIG. 6 is a graph showing a calculation result of variation (normalized) in gain in Example and Comparative Example.

FIG. 6 shows a calculation result of variation in gain (normalized variation in gain) obtained by dividing a difference between the gain with the coupling capacitance C of 1 pF and the gain with the coupling capacitance C of 2 pF by an average of the both gains. As shown in FIG. 6, while variation in the gain in Comparative Example is about 0.70, variation in the gain in Example is about 0.28 and is very small (reduced to about 40% of variation in the gain in Comparative Example).

As such, it is possible to reduce variation in gain (in output voltage) by providing the output variation reduction capacitive element 9. Output voltage may decrease since a capacitive element with a relatively small capacitance is connected as the output variation reduction capacitive element 9. Therefore, it is desirable to provide an amplifier circuit 63 for amplifying a decreased output signal (see FIG. 1).

Specific Configuration of the Multicore Cable Test Device 1

FIG. 7 is a schematic configuration diagram illustrating an example of a specific configuration of the multicore cable test device 1. As shown in FIG. 7, the multicore cable test device 1 is provided with the test signal input means 4, a phase-inverted test signal input means 5, the output-side processing circuit 6, a reference signal generating circuit 7, and the arithmetic device 8 having the corresponding-end identifying unit 81.

The test signal input means 4 has the voltage source 41 (described previously) for generating the test signal V+, the electrodes 442 each brought into contact with an outer circumferential surface of the insulated wire 3 so that the test signal is input to the insulated wire 3 by capacitive coupling, a first amplifier 42 for amplifying the test signal V+, a first switching device 43 for switching the insulated wire 3 to which the test signal V+ amplified by the first amplifier 42 is input, and the electrode substrate 44 (described previously) mounting the plural electrodes 442 which are respectively electrically connected to outputs of the first switching device 43. The electrodes 442 are respectively electrically connected to the outputs of the first switching device 43 and the test signal V+ is applied to the electrode 442 selected by the first switching device 43.

The phase-inverted test signal input means 5 has a first phase shifter 51 for shifting the phase of the test signal V+ branched from the voltage source 41 by 180 degrees to generate a phase-inverted test signal V−, a second amplifier 52 for amplifying the phase-inverted test signal V− from the first phase shifter 51, and a second switching device 53 for switching the insulated wire 3 to which the phase-inverted test signal V− amplified by the second amplifier 52 is input. Outputs of the second switching device 53 are respectively electrically connected to the electrodes 442 of the electrode substrate 44.

In the present embodiment, the phase-inverted test signal V− is generated by adjusting the phase of the voltage source 41 of the test signal input means 4. However, it is not limited thereto and a voltage source for generating the phase-inverted test signal V− may be separately provided. In this case, voltage (amplitude) of the phase-inverted test signal V− is substantially the same as that of the test signal V+. In addition, although the electrode substrate 44 of the test signal input means 4 is also used to input the phase-inverted test signal V− to the insulated wires 3 in the present embodiment, it is not limited thereto. An electrode substrate for inputting the phase-inverted test signal V− may be separately provided.

The output-side processing circuit 6 has the test bench (not shown) having the same structure as the test bench 45 and provided at an end of the multicore cable 2, and is configured that output signals from the insulated wires 3 (signals transmitted through the outer conductors 33) are output by capacitive coupling by pressing electrodes 611 of an electrode substrate 61 respectively against the insulated wires 3.

The output-side processing circuit 6 also has a third switching device 62 electrically connected to each electrode 611 of the electrode substrate 61 to switch the insulated wire 3 from which an output signal is output, the third amplifier 63 for amplifying the output signal from the third switching device 62, a multiplier 64 which produces a detection signal by multiplying the output signal amplified in the third amplifier 63 by a reference signal having the same phase as the test signal V+, and a low-pass filter 65 which removes high-frequency components in the detection signal sent from the multiplier 64.

When signals having the same phase and the same frequency are multiplied with each other by the multiplier 64, a DC component and a component with a frequency double the original frequency are generated. The low-pass filter 65 removes the component with a doubled frequency and outputs only the DC component as the detection signal to the arithmetic device 8.

The reference signal generating circuit 7 has a second phase shifter 71 which produces a reference signal by adjusting the phase of the test signal V+ branched from the voltage source 41, and a fourth amplifier 72 which amplifies the reference signal from the second phase shifter 71 and outputs it to the multiplier 64. The phase shift amount by the second phase shifter 71 is appropriately adjusted by taking into consideration capacitive coupling and phase shifting during transmission through the multicore cable 2, so that the test signal V+ and the reference signal have the same phase in the multiplier 64.

The arithmetic device 8 has the corresponding-end identifying unit 81 which measures voltages of the output signals respectively output from end portions of the insulated wires 3 exposed at the other end of the multicore cable 2 and identifies the other end portion of the insulated wire 3 under test based on the measured voltages of the output signals. In the present embodiment, the corresponding-end identifying unit 81 is configured to identify the other end portion of the insulated wire 3 under test based on voltage of the detection signal output from the low-pass filter 65. The corresponding-end identifying unit 81 is realized by appropriately combining a CPU, a memory such as RAM or ROM, a storage device such as hard disc, a software, and an interface, etc.

The corresponding-end identifying unit 81 has a switch controlling portion 811 which controls switching operations of the first to third switching devices 43, 53 and 62, and a determination portion 812 which determines the correspondence relation between one end portion and the other end portion of the insulated wire 3. In the present embodiment, the determination portion 812 controls the first switching device 43 through the switch controlling portion 811 to input the test signal V+ to an end portion of the insulated wire 3 under test at one end of the multicore cable 2, and also controls the second switching device 53 to input the phase-inverted test signal V− to an end portion of a given insulated wire 3. After that, the determination portion 812 controls the third switching device 62 and sequentially measures voltages of the detection signals from all insulated wires 3 at the other end of the multicore cable 2.

The determination portion 812 identifies that the end portion with the detection signal having the largest voltage, among end portions of the insulated wires 3 exposed at the other end of the multicore cable 2, is the other end portion of the insulated wire 3 under test, and stores the correspondence relation in a storage unit 82. To express the correspondence relation between one end portion and the other end portion of the insulated wire 3, e.g., the numbers sequentially assigned to end portions of the insulated wires 3 arrange in a row at one end of the multicore cable 2 are associated with the numbers sequentially assigned to end portions of the insulated wires 3 arrange in a row at the other end of the multicore cable 2. The determination portion 812 sequentially changes the insulated wire 3 to be tested, identifies the correspondence relation between one end portion and the other end portion of all insulated wires 3, and stores the identified relation in the storage unit 82.

In the present embodiment, the corresponding-end identifying unit 81 also has a verifying portion 813 which determines whether or not an end portion of any of the insulated wires 3 exposed at one end of the multicore cable 2 corresponds to duplicate other end portions. The verifying portion 813 checks if any of the numbers assigned to the other end portions of the insulated wires 3 is duplicated in the correspondence relation which is determined by the determination portion 812 and is stored in the storage unit 82, thereby determining whether or not there is a duplication. This is performed because depending on the positional relation between the insulated wires 3 receiving an input of the test signal V+ and the phase-inverted test signal V−, the common shield 21 and the insulated wire 3 from which the detection signal is acquired, crosstalk of the test signal V+ and crosstalk of the phase-inverted test signal V− may become imbalanced, resulting in misdetection. When it is determined that there is a duplication, the verifying portion 813 changes the insulated wire 3 to which the phase-inverted test signal V− is input, and re-identifies the correspondence relation between one end portion and the other end portion of at least the insulated wire 3 under test having duplicate end portions at the other end.

In the present embodiment, determination of the correspondence relation between one end portion and the other end portion is also performed on the insulated wire 3 receiving an input of the phase-inverted test signal V− in the same manner as the other insulated wires 3 due to the circuit configuration, and misdetection is highly likely to occur in at least the insulated wire 3 receiving an input of the phase-inverted test signal V−. Therefore, in the present embodiment, the verifying portion 813 determines, at least once, that there is a duplication, and identifies the correspondence relation between one end portion and the other end portion of the insulated wire 3 having a duplication.

In the multicore cable test device 1, the test signal V+ and the phase-inverted test signal V− are both input so that the two test signals V+ and V− cause crosstalk and cancel each other out in the other insulated wires 3 to which the test signals V+ and V− are not input. As a result, it is possible to reduce the effect of crosstalk and to accurately identify the correspondence relation between one end portion and the other end portion of the insulated wires 3. The invention is particularly suitably applicable to the multicore cable 2 in which multiple insulated wires 3 are densely arranged and a coupling capacitance between the insulated wires 3 is large. In addition, use of the invention is highly effective in case that the multicore cable 2 has the common shield 21 since the coupling capacitance is larger than when not having the common shield 21.

Where to Position the Output Variation Reduction Capacitive Element 9

The output variation reduction capacitive elements 9 can be provided either on the test signal input side or the output side. However, in view of electrical characteristics, the output variation reduction capacitive elements 9 are more desirably provided on the test signal output side, i.e., on the output-side processing circuit 6. Alternatively, the output variation reduction capacitive elements 9 may be provided on both the test signal input side and the output side.

In the configuration of the present embodiment, the same number of output variation reduction capacitive elements 9 as the electrodes 611 are provided on the electrode substrate 61 and the electrodes 611 are respectively electrically connected to inputs of the third switching device 62 via the variation reduction capacitive elements 9. In other words, in the present embodiment, the variation reduction capacitive elements 9 are mounted on the electrode substrate 61 and connected in series to the electrodes 611. This allows good electrical characteristics to be maintained even when, e.g., work of pressing the electrode substrate 61 against the insulated wires 3 arranged on the test bench is automated and the electrode substrate 61 is connected to the output-side processing circuit 6 in the subsequent stage by an insulated wire such as coaxial wire or a cable.

However, it is not limited thereto. For example, a single output variation reduction capacitive element 9 may be provided between the third switching device 62 and the third amplifier 63. In this case, since there is only one output variation reduction capacitive element 9, the cost is lower and the circuit configuration is simpler. However, when the electrode substrate 61 is connected to the output-side processing circuit 6 in the subsequent stage by an insulated wire such as coaxial wire or a cable as mentioned above, a capacitive element with a relatively small capacitance is provided immediately after the insulated wire or cable and it is difficult to obtain impedance matching with the insulated wire or cable. This may result in that output decreases due to impedance mismatching and electrical characteristics thereby degrade. Therefore, in such a case, it is desirable to provide the output variation reduction capacitive element 9 on the electrode substrate 61.

When the output variation reduction capacitive elements 9 are provided on the test signal input side, the configuration may be such that the same number of output variation reduction capacitive elements 9 as the electrodes 442 are provided on the electrode substrate 44 and the electrodes 442 are respectively electrically connected to inputs of the switching devices 43 and 53 via the output variation reduction capacitive elements 9. Alternatively, when the output variation reduction capacitive elements 9 are provided on the test signal input side, the output variation reduction capacitive elements 9 may be provided respectively between the first amplifier 42 and the first switching device 43 and between the second amplifier 52 and the second switching device 53.

Method for Manufacturing the Multicore Cable Assembly

Figure 8A:
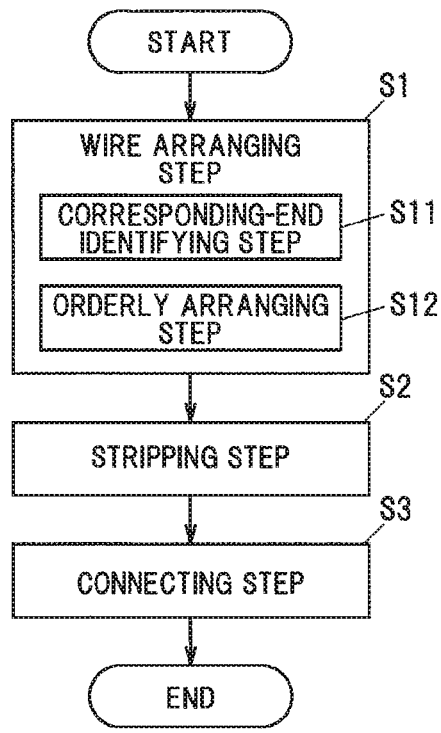
FIG. 8A is a flowchart showing a method for manufacturing a multicore cable assembly.

FIG. 8A is a flowchart showing a method for manufacturing a multicore cable assembly. As shown in FIG. 8A, the method for manufacturing a multicore cable assembly in the present embodiment includes a wire arranging step as Step S1, a stripping step as Step S2 and a connecting step as Step S3 which are performed sequentially.

In the wire arranging step as Step S1, a corresponding-end identifying step to identify a correspondence relation between one end portion and the other end portion of the insulated wires 3 exposed from both ends of the multicore cable 2 is performed in Step S11, and an orderly arranging step to arrange the end portions of the insulated wires 3 exposed from both ends of the multicore cable 2 in desired order is then performed in Step S12. In the stripping step as Step S2, the exposed length of each insulated wire 3 is adjusted (by cutting and removing an excess length), and also the conductor (the center conductor 31 and the outer conductor 33 of the coaxial wire 30 in this example) is exposed at ends of each insulated wire 3. In the connecting step as Step S3, the exposed conductors are connected to terminals of connectors or electrode patterns of circuit boards (not shown), etc., by soldering, etc. Through these steps, a multicore cable assembly having connectors or circuit boards at both ends of the multicore cable 2 is obtained.

Method for Testing the Multicore Cable

Figure 8B:
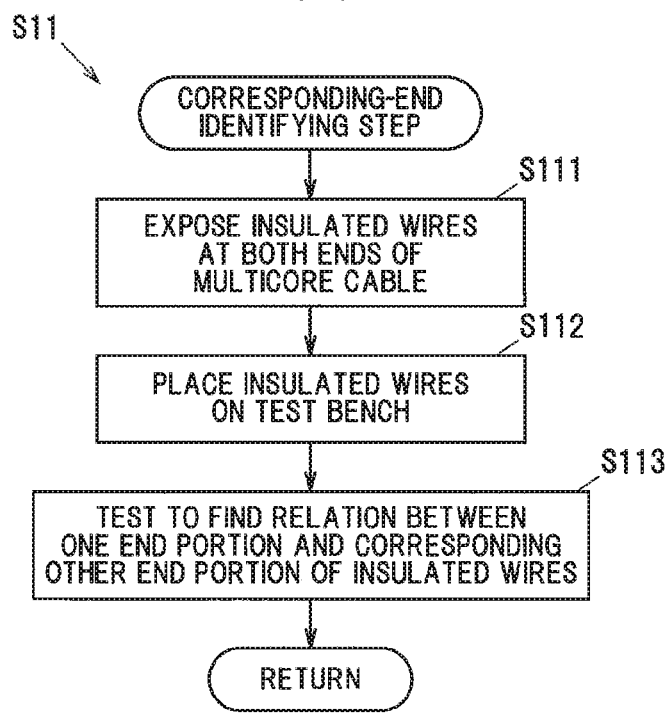
FIG. 8B is a flowchart showing a process of a corresponding-end identifying step in the manufacturing method.

FIG. 8B is a flowchart showing a process of the corresponding-end identifying step as Step S11. As shown in FIG. 8B, in the corresponding-end identifying step as Step S11, i.e., in the method for testing a multicore cable in the present embodiment, firstly, the insulated wires 3 are exposed at both ends of the multicore cable 2 by removing a predetermined length of the jacket 22 and the common shield 21 in Step S111. After that, in Step S112, the exposed insulated wires 3 are respectively fitted to the locking grooves 452a of the test bench 45 at both ends of the multicore cable 2, and the electrode substrates 44 and 61 are pressed against the insulated wires 3 which are fixed to the test bench 45. Then, a test is conducted to identify a correspondence relation between one end portion and the other end portion of each insulated wire 3 in Step S113. The method for testing a multicore cable in the present embodiment is performed by using the multicore cable test device 1 shown in FIG. 7. That is, voltages of output signals are measured in a state that the output variation reduction capacitive elements 9 are connected in series with coupling capacitances Cc generated by capacitive coupling.

In Step S113, firstly, the test signal V+ is input, by capacitive coupling and through the electrode substrate 44 (the electrode 442), to an end portion of the insulated wire 3 under test among end portions of the insulated wires 3 exposed at one end of the multicore cable, and also the phase-inverted test signal V− is input, by capacitive coupling and through the electrode substrate 44 (the electrode 442), to an end portion of the insulated wire 3 other than the end portion of the insulated wire 3 under test. After that, the determination portion 812 controls the third switching device 62 through the switch controlling portion 811, measures voltage of an output signal (in this example, a detection signal produced by multiplying the output signal by a reference signal) output from an end portion of each insulated wire 3 exposed at the other end of the multicore cable 2, and determines that the other end portion of the insulated wire 3 with the largest output voltage is the other end portion of the insulated wire 3 under test. By performing such determination while changing the insulated wire 3 receiving an input of the test signal V+ by the first switching device 43, the correspondence relation between one end portion and the other end portion of all insulated wires is identified. Then, the verifying portion 813 determines whether or not an end portion of any of the insulated wires 3 exposed at one end of the multicore cable 2 corresponds to duplicate other end portions, and when duplication is determined, the insulated wire 3 determined as having a duplication is retested.

Functions and Effects of the Embodiment

As described above, in the method for testing a multicore cable in the present embodiment, voltages of output signals are measured in a state that the output variation reduction capacitive elements 9 are connected in series with coupling capacitances generated by capacitive coupling. As a result, even when variation in coupling capacitance occurs due to capacitive coupling, it is possible to reduce variation in output voltage and thereby suppress a decrease in detection accuracy. In other words, according to the present embodiment, it is possible to provide a multicore cable testing method of which detection accuracy is improved by reducing variation in output voltage caused by variation in coupling capacitance.

In addition, since variation in output voltage can be reduced, it is possible to increase allowable variation in coupling capacitance. Therefore, it is possible to accurately identify the correspondence relation between one end portion and the other end portion of the insulated wires 3 even when, e.g., the electrode 442 or 611 is slightly misaligned with respect to the insulated wire 3, the outer covering has a thickness abnormality, or minute foreign matter such as dust is sandwiched between the electrode 442 or 611 and the insulated wire 3.

When, e.g., the insulated wire 3 is very thin (e.g., a diameter of not more than 1 mm), displacement in the event of misalignment is very small and it is necessary to use an expensive alignment device, etc., for accurate positioning. However, in the present embodiment, such expensive alignment device, etc., is not required, hence, low cost. Meanwhile, when minute foreign matter such as dust is sandwiched between the electrode 442 or 611 and the insulated wire 3, it is necessary to remove the foreign matter in the conventional technique and it thus takes time for detection. However, in the present embodiment, it is not necessary to remove the foreign matter as log as it is very small and it is thus possible to reduce time for identifying the correspondence relation.

Modification

Figure 9:
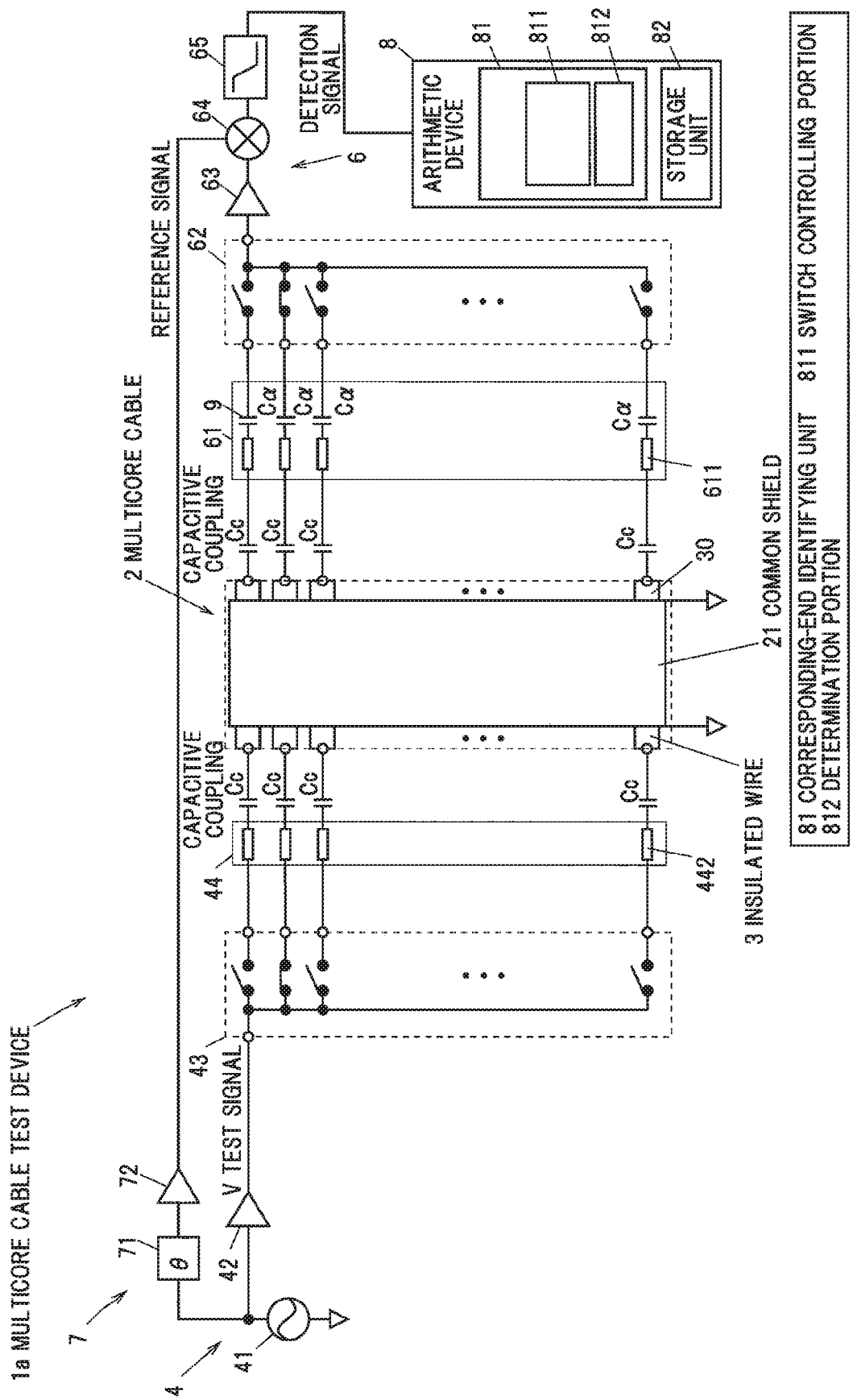
FIG. 9 is a schematic configuration diagram illustrating a multicore cable test device in a modification of the invention.

Although the effect of crosstalk is reduced by inputting two signals, the test signal and the phase-inverted test signal, in the embodiment, it is not limited thereto. It is possible to configure to input only the test signal. In this case, the phase-inverted test signal input means 5 is omitted and the common shield 21 of the multicore cable 2 is grounded, as is a multicore cable test device 1a shown in FIG. 9. Since crosstalk is divided by grounding the common shield 21 (by keeping the common shield 21 at the same potential as a measurement system ground), output voltage from end portions of the insulated wires 3 not receiving input of the test signal V is reduced to smaller than the output voltage from an end portion of the insulated wire 3 to which the test signal V is input, and the effect of crosstalk is thereby reduced.

SUMMARY OF THE EMBODIMENTS

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A method for testing a multicore cable (2) that comprises a single common shield (21) covering a plurality of insulated wires (3), the testing method comprising: inputting a test signal, by capacitive coupling, to an end portion of the insulated wire (3) under test among end portions of the insulated wires (3) exposed at one end of the multicore cable (2); and measuring voltages of output signals output by capacitive coupling respectively from end portions of the insulated wires (3) exposed at the other end of the multicore cable (2), and identifying the other end portion of the insulated wire (3) under test based on the measured voltages, wherein the voltages of output signals are measured in a state that an output variation reduction capacitive element (9) is connected in series with a coupling capacitance generated by the capacitive coupling.

[2] The method for testing a multicore cable defined by [1], wherein the output variation reduction capacitive element (9) is provided on an output-side processing circuit (6) that processes the output signals.

[3] The method for testing a multicore cable defined by [2], wherein the output-side processing circuit (6) comprises an electrode substrate (61) comprising a plurality of connection electrodes (611) that are capacitively coupled to other end portions of the insulated wires (3), and the output variation reduction capacitive element (9) is connected in series to the connection electrodes (611) mounted on the electrode substrate (61).

[4] The method for testing a multicore cable defined by [2] or [3], comprising: an amplifier circuit (63) that amplifies the output signals.

[5] A method for manufacturing a multicore cable assembly that comprises a multicore cable (2) comprising a single common shield (21) covering a plurality of insulated wires (3) and connectors or circuit boards provided at both ends of the multicore cable (2), the manufacturing method comprising: arranging wires; stripping the insulated wires (3) to expose conductors at end portions; and connecting the exposed conductors to terminals of the connectors or electrode patterns of the circuit board, wherein the arranging wire comprises identifying a corresponding end portion by identifying a correspondence relation between one end portion and the other end portion of the insulated wires (3) exposed from both ends of the multicore cable (2) and arranging end portions of the insulated wires (3) exposed from the both ends of the multicore cable (2) in desired order, the identifying a corresponding end portion comprises inputting a test signal, by capacitive coupling, to an end portion of the insulated wire (3) under test among end portions of the insulated wires (3) exposed at one end of the multicore cable (2), measuring voltages of output signals output by capacitive coupling respectively from end portions of the insulated wires (3) exposed at the other end of the multicore cable (2), and identifying the other end portion of the insulated wire (3) under test based on the measured voltages, and the voltages of output signals are measured in a state that an output variation reduction capacitive element (9) is connected in series with a coupling capacitance generated by the capacitive coupling.

[6] A multicore cable test device (1) for testing a multicore cable (2) comprising a single common shield (21) covering a plurality of insulated wires (3) to identify a correspondence relation between one end portion and the other end portion of the insulated wires (3) exposed from both ends of the multicore cable (2), the device comprising: a test signal input means (4) that inputs a test signal, by capacitive coupling, to an end portion of the insulated wire (3) under test among end portions of the insulated wires (3) exposed at one end of the multicore cable (2); a corresponding-end identifying unit (81) that measures voltages of output signals output by capacitive coupling respectively from end portions of the insulated wires (3) exposed at the other end of the multicore cable (2), and identifies the other end portion of the insulated wire (3) under test based on the measured voltages; and an output variation reduction capacitive element (9) that is connected in series with a coupling capacitance generated by the capacitive coupling.

Although the embodiment of the invention has been described, the invention according to claims is not to be limited to the embodiment. Further, please note that all combinations of the features described in the embodiment are not necessary to solve the problem of the invention. In addition, the invention can be appropriately modified and implemented without departing from the gist thereof.

What is claimed is:

1. A method for testing a multicore cable that comprises a single common shield covering a plurality of insulated wires, the testing method comprising:
inputting a test signal, by capacitive coupling through an electrode arranged to partially cover the insulated wire, to an end portion of the insulated wire under test among end portions of the insulated wires exposed at one end of the multicore cable;
providing an output voltage variation reduction capacitive element connected in series with the electrode;
measuring voltages of output signals output by the capacitive coupling respectively from end portions of the insulated wires exposed at the other end of the multicore cable; and
identifying the other end portion of the insulated wire under test based on the measured voltages,
wherein the voltages of output signals are measured in a state that the output voltage variation reduction capacitive element is connected in series with the coupling capacitance generated by the capacitive coupling through the electrode.

2. The method according to claim 1, wherein the output variation reduction capacitive element is provided on an output-side processing circuit that processes the output signals.

3. The method according to claim 2, wherein the output-side processing circuit comprises an electrode substrate comprising a plurality of connection electrodes that are capacitively coupled to other end portions of the insulated wires, and the output variation reduction capacitive element is connected in series to the connection electrodes mounted on the electrode substrate.

4. The method according to claim 2, wherein the output-side processing circuit comprises an amplifier circuit that amplifies the output signals.

5. A method for manufacturing a multicore cable assembly that comprises a multicore cable comprising a single common shield covering a plurality of insulated wires and connectors or circuit boards provided at both ends of the multicore cable, the manufacturing method comprising:
   arranging wires;
   stripping the insulated wires to expose conductors at end portions; and
   connecting the exposed conductors to terminals of the connectors or electrode patterns of the circuit board,
     wherein the arranging wire comprises identifying a corresponding end portion by identifying a correspondence relation between one end portion and the other end portion of the insulated wires exposed from both ends of the multicore cable and arranging end portions of the insulated wires exposed from the both ends of the multicore cable in desired order, the identifying a corresponding end portion comprises inputting a test signal, by capacitive coupling through an electrode arranged to partially cover the insulated wire, to an end portion of the insulated wire under test among end portions of the insulated wires exposed at one end of the multicore cable, providing an output voltage variation reduction capacitive element connected in series with the electrode; measuring voltages of output signals output by the capacitive coupling respectively from end portions of the insulated wires exposed at the other end of the multicore cable, and identifying the other end portion of the insulated wire under test based on the measured voltages, and the voltages of output signals are measured in a state that the output voltage variation reduction capacitive element is connected in series with the coupling capacitance generated by the capacitive coupling through the electrode.

6. A multicore cable test device for testing a multicore cable comprising a single common shield covering a plurality of insulated wires to identify a correspondence relation between one end portion and the other end portion of the insulated wires exposed from both ends of the multicore cable, the device comprising:
   a test signal input means that inputs a test signal, by capacitive coupling through an electrode arranged to partially cover the insulated wire, to an end portion of the insulated wire under test among end portions of the insulated wires exposed at one end of the multicore cable;
   a corresponding-end identifying unit that measures voltages of output signals output by the capacitive coupling respectively from end portions of the insulated wires exposed at the other end of the multicore cable, and identifies the other end portion of the insulated wire under test based on the measured voltages; and
   an output voltage variation reduction capacitive element that is connected in series with the coupling capacitance generated by the capacitive coupling through the electrode.

* * * * *